US005770345A

United States Patent [19]

Babich et al.

[11] Patent Number: 5,770,345
[45] Date of Patent: *Jun. 23, 1998

[54] PHOTORESIST HAVING INCREASED SENSITIVITY AND USE THEREOF

[75] Inventors: Edward Darko Babich, Chappaqua; Karen Elizabeth Petrillo, Mahopac; John Patrick Simons, Cold Spring; David Earle Seeger, Congers, all of N.Y.

[73] Assignee: International Business Machines Corporation, Armonk, N.Y.

[*] Notice: The term of this patent shall not extend beyond the expiration date of Pat. No. 5,593,812.

[21] Appl. No.: 680,668

[22] Filed: Jul. 16, 1996

Related U.S. Application Data

[63] Continuation of Ser. No. 389,864, Feb. 17, 1995, Pat. No. 5,593,812.

[51] Int. Cl.$^6$ .................................................. G03F 7/039
[52] U.S. Cl. ................. 430/270.1; 430/905; 430/907; 430/914; 430/915; 430/919; 430/920; 430/922; 430/923; 430/924; 522/9; 522/16; 522/17; 522/25; 522/26; 522/27; 522/28; 522/30; 522/18; 522/20; 522/21; 522/12
[58] Field of Search .............................. 430/270.1, 905, 430/907, 914, 915, 919, 920, 922, 923, 924; 522/9, 16, 17, 25, 26, 27, 28, 30, 18, 20, 21, 12

[56] References Cited

U.S. PATENT DOCUMENTS

| 1,587,269 | 6/1926  | Murray .............................. 430/270 X |
| 3,779,778 | 12/1973 | Smith et al. ......................... 96/115 R |
| 4,250,053 | 2/1981  | Smith ................................. 522/25 X |
| 4,258,121 | 3/1981  | Kojima ................................. 430/281 |
| 4,343,885 | 8/1982  | Reardon, Jr. ........................... 522/9 X |
| 4,618,564 | 10/1986 | Demmer et al. .................... 430/270.1 |
| 5,198,323 | 3/1993  | Kitao et al. ....................... 430/920 X |
| 5,403,695 | 4/1995  | Hayase et al. ........................ 430/192 |
| 5,466,557 | 11/1995 | Haley et al. ....................... 430/270.1 |
| 5,492,793 | 2/1996  | Breyta et al. ..................... 430/270.14 |

FOREIGN PATENT DOCUMENTS 893063  4/1962  United Kingdom .

*Primary Examiner*—Cynthia Hamilton
*Attorney, Agent, or Firm*—Pollock, Vande Sande & Priddy

[57] ABSTRACT

The sensitivity of a photoresist to actinic light is improved by the addition of certain dyes. The photoresist includes a polymer matrix, a photosensitive acid generator and at least one compound selected from the group consisting of dyes containing at least one heterosulphur atom such as $2,2^1,5^1,2"$-terthiophene and its derivatives; thianthrene and its derivatives, and 4,6-diphenylthieno(3,4-d)-1,3-dioxol-2-one-5,5-dioxide; phenylsulfone and its derivatives; and 4,5-diphenyl-1,3-dioxol-2-one; 3,4-bis(acetoxymethyl)furan; chelidonic acid and its derivatives; and 5,7,12,14-pentacenetetrone. Resist images on a substrate are formed from the compositions.

15 Claims, 3 Drawing Sheets

PHOTORESIST HAVING INCREASED SENSITIVITY AND USE THEREOF

This is a continuation of U.S. patent application Ser. No. 08/389,864, filed Feb. 17, 1995, now 5,593,812.

TECHNICAL FIELD

The present invention is concerned with improving the sensitivity and lithographic properties of photoresists and particularly chemically amplified photoresists. The present invention is of particular importance in deep UV applications. The addition of certain dyes to photoresist composition containing a polymer matrix and photosensitive acid generator significantly increased its sensitivity and improved its lithographic properties including reducing the swing curve and permitting control of reflective notching.

BACKGROUND OF INVENTION

The design of chemically amplified resist systems based on acid-catalyzed chain reactions (e.g., polymerization, depolymerization, side chain cleavage, etc.) has been recognized as a viable route to high sensitivity resist systems in microlithography. Such systems are described in, e.g., Polymers In Electronics, Davidson T. Ed., ACS Symposium pages 11, H. Ito, C. G. Willson. These systems offer the high sensitivity attendant with chemical amplification but avoid the drawbacks of free radical based systems. Systems of this type are capable of high resolution, i.e., submicron in the case of semiconductor applications. Since they are oxygen insensitive, they can be applied in liquid form as thin films.

Photoresists which function via an acid-catalyzed deprotection mechanism utilize polymers which are positive acting. That is, the unexposed resist is insoluble in the developer, but is converted into a soluble material upon exposure. Chemically, this is accomplished by changing the side group chemistry through thermal cleavage, a reaction which is acid-catalyzed. Compounds such as iodonium salts generate acid upon photo or thermally induced decomposition.

These materials, however, could stand further improvement with respect to sensitivity to the actinic light employed and especially when deep UV is employed. These materials also suffer from another problem commonly referred to as "swing curve." In particular, as the resist thickness varies, for instance, due to wafer topography, the linewidth changes. It could, therefore, be desirable to reduce the linewidth variation from the minimum to the maximum on the swing curve. Likewise, it would be desirable to better control the reflective notching that occurs in such systems.

SUMMARY OF INVENTION

The present invention significantly increases the sensitivity of the photoresist to the actinic light employed along with improving certain of its lithographic characteristics. The present invention greatly reduces linewidth variation from minimum to maximum on the swing curve and helps to control reflective notching.

In particular, the present invention is directed to a photoresist composition that exhibits increased sensitivity comprising a polymer matrix, photosensitive acid generator, and certain compounds. The compounds include dyes having al least one heterosulfur atom such as 2,2',5',2"-terthiophene and its derivatives, thianthrene and its derivatives, 4,6-diphenylthieno (3,4-d)-1,3-dioxol-2-one-5,5-dioxide;

polythiophenes; 1,2-benzodiphenylene sulfide; tetraphenylthiophene and its derivatives; 4(2-thienyl) butyric acid and its derivatives; 3(2-thienyl) acrylic acid and derivatives; DL-thioctic acid and its derivatives; 3-thiophene malonic acid and its derivatives; 2-thiophene glyoxylic acid and its derivatives; and thenoyltrifluoroacetone. Other suitable compounds are phenylsulfone and its derivatives; 4,5-diphenyl-1,3-dioxol-2-one; 3,4-bis(acetoxymethyl)furan; chelidonic acid and its derivatives; and 5,7,12,14-pentacenetetrone.

The present invention is also concerned with the use of the above compositions to produce a resist image on a substrate. The method comprises coating the substrate with the above disclosed photoresist composition then imagewise expose the photoresist to actinic light, and then develop the photoresist to produce the desired resist image.

BEST AND VARIOUS MODES FOR CARRYING OUT INVENTION

Figure 1:
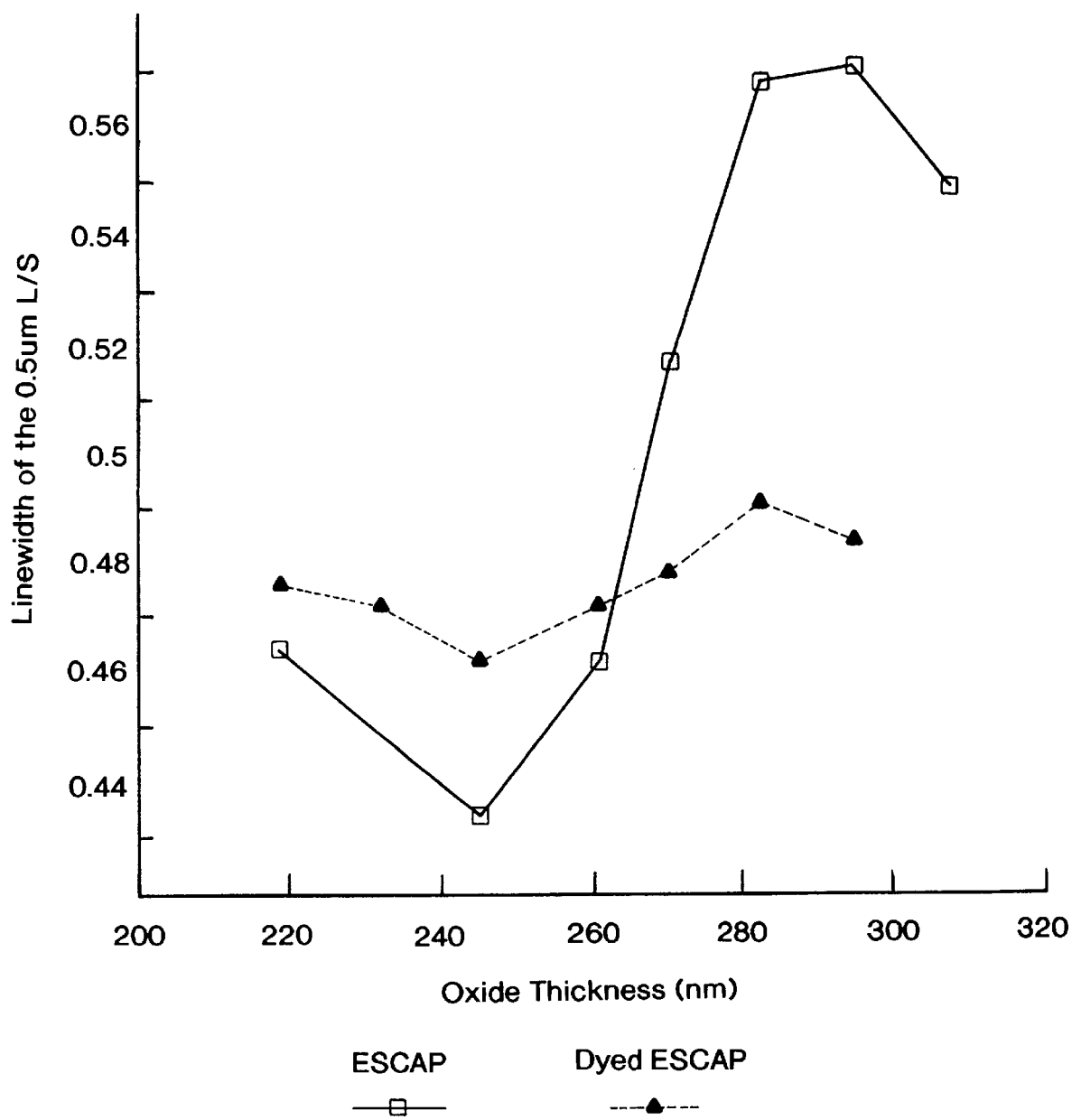
FIG. 1 is a graph illustrating the swing curve for a composition of the present invention and that for a composition outside the scope of the present invention.

The present invention is concerned with a positive photosensitive resist composition that comprises a film forming reactive polymer containing groups which react upon acid catalysis; and an initiator which generates acid upon exposure to the actinic light, thereby producing acid catalysis of the film forming reactive polymer.

The preferred polymers of the present invention are vinylic polymers containing recurrent pendant groups that undergo efficient acidolysis to produce products that are very different in polarity (solubility) than their precursors. The invention, however, is not limited to polymers obtained by vinylic addition polymerization. Other polymerizations such as condensation, polyaddition, and addition condensation can be employed to synthesize polymers useful in the present invention.

The preferred acid labile pendant groups are tertbutyl esters of carboxylic acids and tertbutyl carbonates of phenols but, it is understood that a wide range of acid labile groups are operative in the invention. These include trityl, benzyl, benzyhydryl modifications as well as others well known in the art.

The most preferred polymers employed contain phenolic hydroxy groups such as hydroxystyrene groups or novolak resins. These materials include copolymers thereof and include copolymers of hydroxystyrene and methacrylates and/or acrylates such as t-butyl methacrylate; poly (hydroxystyrene), poly(hydroxystyrene-co-t-butyloxycarbonyloxystyrene), poly(hydroxystyrene-co-hydroxymethylstyrene), poly(hydroxystyrene-co-acetoxymethylstyrene) alkyl substituted polyvinyl phenols and novolak resins such as cresol novolak, ethylphenol. novolaks and xylenol novolaks.

Other suitable polymers are poly(p-tert-butoxycarbonyloxy-A-methylstyrene), poly(p-tert-butoxycarbonyloxystyrene), poly(tert-butyl p-vinylbenzoate), poly(tert-butyl p-isopropenylphenyloxyacetate), and poly(tert-butyl methacrylate).

The preferred polymer being represented by the following formula:

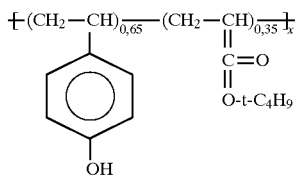

I

The compositions of the present invention also contain a photoinitiator and especially cationic initiators. In the event a positive working photoresist composition is desired, the photoinitiator employed is one which will generate a Bronsted acid upon exposure to actinic light. Examples of such photoinitiators are well-known and include onium salts and especially Group VIA and Group VIIA salts such as the pyrylium, selenonium, sulfonium, and iodonium salts. Various suitable photoinitiators are discussed in U. S. Pat. Nos. 4,161,478; 4,442,197; 4,139,655; 4,400,541; 4,197,174; 4,173,476; and 4,299,938; and European patent application 44/0094914 and 84/0126712, disclosures of which re incorporated herein by reference.

Also see Watt, et al., "A Novel Photoinitiator of Cationic Polymerization: Preparation and Characterization of Bis[4-(diphenylsulfonio)phenyl]-sulfide-Bis-Hexafluorophosphate", *Journal of Polymer Science: Polymer Chemistry Edition*, Vol. 22, p. 1789, (1980) John Wiley & Sons, Inc.

Additional discussions concerning sulfonium and iodonium salts can be found, for instance, in Crivello,. et al., "Complex Triarylsulfonium Salt Photoinitiators. II. The Preparation of Several New Complex Triarylsulfonium Salts and the Influence of Their Structure in Photoinitiated Cationic Polymerization", *Journal of Polymer Science: Polymer Chemistry Edition*, Vol. 18, pp. 2697–2714 (1980) John Wiley & Sons, Inc.; Pappas, et al, "Photoinitiation of Cationic Polymerization. III. Photosensitization of Diphenyliodonium and Triphenylsulfonium Salts," *Journal of Polymer Science: Polymer Chemistry Edition*, Vol. 22, pp. 77–84, (1984) John Wiley & Sons, Inc.; Crivello, et al., "Photoinitiated Cationic Polymerization With Triarylsulfonium Salts," *Journal of Polymer Science: Polymer Chemistry Edition*, Vol. 17, pp. 977–999, (1979) John Wiley & Sons, Inc.; Crivello, et al., "Complex Triarylsulfonium Salt Photoinitiators. I. The Identification, Characterization, and Syntheses of a New Class of Triarylsulfonium Salt Photoinitiators," *Journal of Polymer Science: Polymer Chemistry Edition*, Vol. 1822, pp. 2677–2695, (1980), John Wiley & Sons, Inc.; and Crivello, "Cationic Polymerization—Iodonium and Sulfonium Salt Photoinitiators," *Advances In Polymer Science*, Series #62, pp. 1–48 (1984), Springer-Verlag.

Typical of the onium salts are diaryliodonium and triarylsulfonium salts. These photoacids may include diphenyliodonium hexafluoroarsenate, di(t-butylphenyl)-iodonium hexafluoroarsenate, diphenyliodonium hexafluoroantiomonate, di(t-butylphenyl)iodonium hexafluoroantimonate, diphenyliodonium triflate, di(tibutylphenyl)iodonium triflate, triphenylsulfonium hexafluoroantimonate, triphenylsulfonium hexafluoroarsinate, tri(t-butylphenyl)sulfonium hexafluoroarsenate, triphenylsulfonium hexafluorophosphate, tri (t-butylphenyl)sulfonium hexafluorophosphate, triphenylsulfonium triflate and tri(t-butylphenyl) sulfonium triflate.

Among the non-metallic sulfonic acid precursors which generate strong acids upon exposure to radiation are N-sulfonyloxyimides of the form

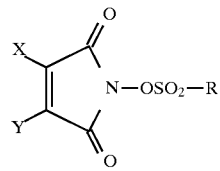

where R is selected from the group consisting of —$CF_3$, —$CF_2CF_3$, —$CF_2$, $CF_2H$, —$(CF_2)_n$—Z where n=1 to 4, where Z is H, alkyl, aryl,

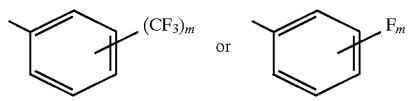

where m=1 to 5, where X and Y either (1) form a cyclic or polycyclic ring which may contain one or more hetero atoms, (2) form a fused aromatic ring, (3) may be independently H, alkyl or aryl, (4) may be attached to another sulfonyloxyimide-containing residue, or (5) may be attached to a polymeric chain or backbone.

The preferred initiator being represented by the following formula:

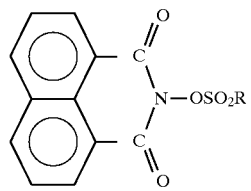

II wherein R=$C_{10}H_{21}$.

The photoacid generator or initiator is generally present in the range from about 0.5 to 10% by weight, based on the weight of the polymer solids in the photoresist composition.

The compounds required according to the present invention must be capable of significantly increasing the absorption of the composition at 248 nm as compared to the composition without such compound; must not poison the composition and must be capable of withstanding the processing conditions including thermal treatments up to about 160° C. The following materials have been found pursuant to this invention to satisfy all of these requirements:

1) Dyes having heterosulfur group such as
a) 2,2',5',2"-Terthiophene and its derivatives:

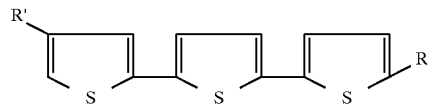

b) Polythiophenes

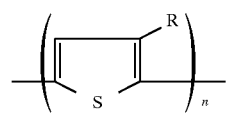

wherein n = 10–100 c) 1,2-benzodiphenylene sulfide

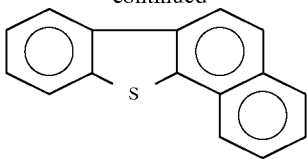

d) Tetraphenylthiophene and its derivatives

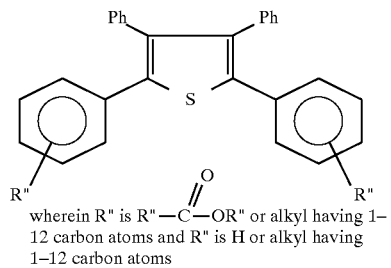

wherein R'' is R''—C(=O)—OR'' or alkyl having 1–12 carbon atoms and R''' is H or alkyl having 1–12 carbon atoms e) 4(2-thienyl)butyric acid and derivatives

f) 3(2-thienyl)acrylic acid and derivatives

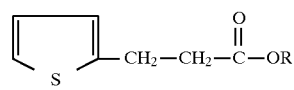

g) DL-thioctic acid and derivatives

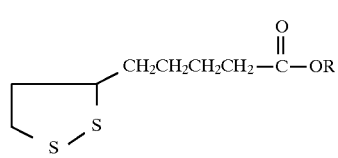

h) 3-thiophene malonic acid and derivatives

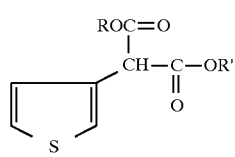

i) 2-thiopheneglyoxylic acid and derivatives

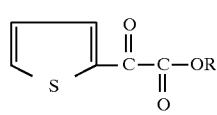

j) Thenoyltrifluoroacetone

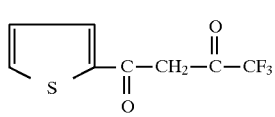

k) Thianthrene and its derivatives;

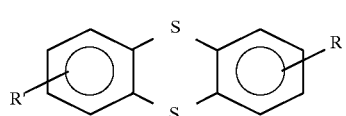

and;

1) 4,6-Diphenylthieno(3,4-d-1,3-dioxol-2-one-5,5-dioxide;

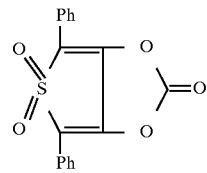

2) Phenylsulfone and its derivatives;

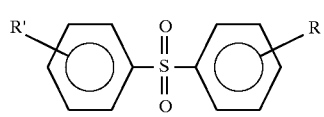

3) 4,5-Diphenyl-1,3-dioxol-2-one

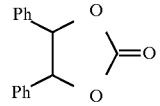

4) 3,4-bis(acetoxymethyl)furan

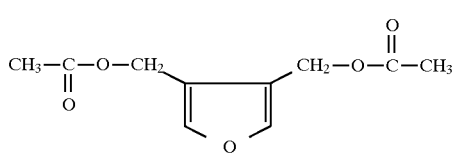

5) Chelidonic acid and its derivatives

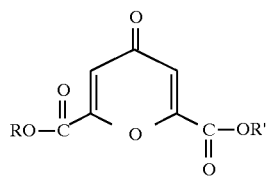

6) 5,7,12,14-Pentacenetetrone

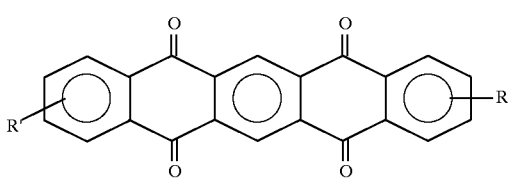

R and R' in the above formulae are individually selected from the group of H, alkyl having 1 to 12 carbon atoms, aryl having 6 to 18 carbon atoms,

wherein $R^{IV}$ is H or alkyl having 1 to 12 carbon atoms.

The compound is typically employed in amounts of about 1 to about 20% atomic, and preferably about 5 to about 10% atomic based upon the polymer solids in the composition.

In addition, the compositions, when desired, can include an organic non-reactive diluent to facilitate the coating operation. Examples of suitable solvents include ketones such as methyl ethyl ketone, methyl isobutyl ketone and methyl amyl ketone, and methylene chloride, 1-methoxy-2-propyl acetate (A2 1500 thinner), (±)-1-methoxy-2-propanol, ethyl-3-ethoxypropionate, ethyl (S)-(-)-lactate, ethoxyethanol, diglyme(2-methoxyethylether). When employed the diluent is present in the amount sufficient to provide compositions for coating application.

The compositions can be coated onto substrates such as semiconductor substrates, such as silicon, galthium arsenide and germanium silicide, metal, composites such as epoxy, cyanate ester, and polyimide based laminates, ceramics, and glass or other materials onto which photoprocessable coatings are normally employed. The compositions can be applied by various known coating techniques such as spinning, spraying, dipping, film laminating or passing the substrate through a bath of the composition.

The compositions after coating onto a substrate and removal of volatile solvents, if present, the coating is imagewise exposed to actinic light and preferably to deep UV light radiation in a predetermined pattern with energy ranging from 0 to about 100 MJ/cm². The exposure being through an image bearing transparency of the desired pattern.

The composition is then subjected to elevated temperatures of about 100° C. to about 160° C. and preferably about 130° C. to about 160° C. This heating is usually carried out for about 1 to about 20 minutes and preferably about 1 to about 5 minutes.

After exposure to actinic light and subsequent heating, the coating is developed by removing areas struck by actinic light in the case of positive resist. This can be accomplished by immersing or spraying the film with a suitable developer. Some suitable developers include Shipley MF321 (tetramethyl ammonium hydroxide in water) or microposit 2401 (potassium hydroxide in water). The developer selected is one which will dissolve the exposed portions of the composition without attacking, to any undesired extent, the unexposed portions of the composition. Suitable developers can be readily determined by persons skilled in the art once they are aware of the present disclosure without undue experimentation.

Moreover, when desired, the film can be post-cured by subjecting the films to elevated temperatures such as about 100° C. to about 160° C. and preferably about 120°C. to about 160°C. for about 1 to about 10 minutes.

Typical film thickness of the composition are about 0.5 to about 10 microns and more typically about 1 to about 3 microns (dry).

The following non-limiting examples are presented to further illustrate the present invention:

EXAMPLE 1

A deep UV formulation was prepared in PMA solution (about 17% solids), consisting of 2 g of the polymer matrix of formula I above, about 0.08 g of initiator compound of formula II above, about 0.17 g of thianthrene. The composition was coated on a silicon wafer, post-apply baked (PAB) at about 160° C. for 2 min and then exposed on ULTRATECH stepper (model X-248) or on GCA-248 Excimer laser stepper. The resist was then post-exposure baked (PEB) at about 150° C. for about 2 min and developed in AZ 321 developer (tetromethyl ammonium hydroxide in water).

The effectiveness of the use of the dye in the composition was examined by measuring swing curves with and without the dye. The results are shown in FIG. 1.

It was found that the variation in linewidth from minimum to maximum without the dye was 0.148 mu. The addition of thianthrene (8.5% wt.) reduced the linewidth variation from minimum to maximum to 0.038 mu.

In this example the sensitivity was enhanced by 48%. Measurements on ULTRATECH stepper showed sensitivity of 16 mJ/cm$_2$ for the dyed formulation compared to 29 mJ/cm² for the undyed version.

Figure 2:
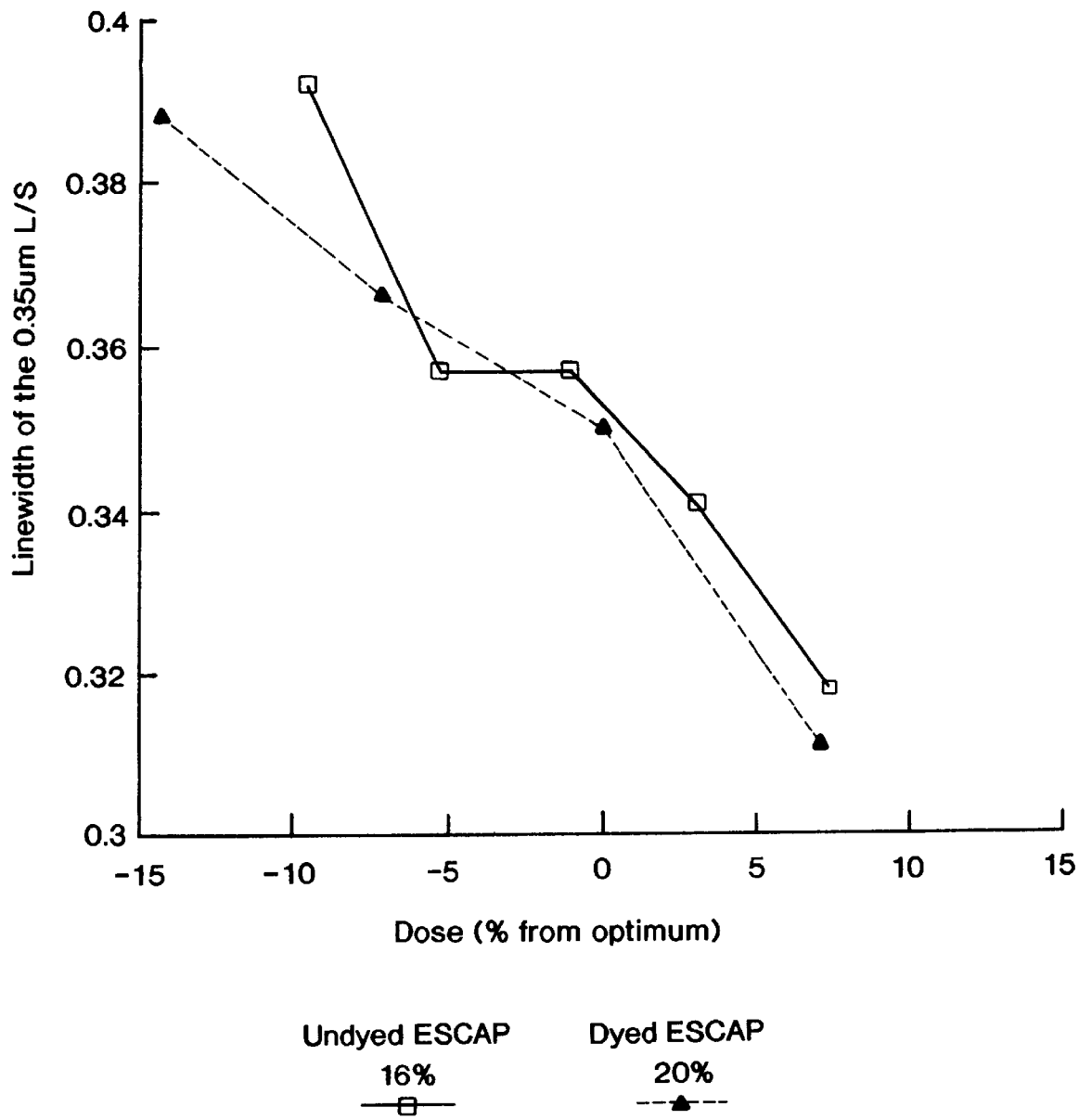
FIG. 2 is a graph illustrating the exposure latitude for a composition of the present invention and that for a composition outside the scope of the invention.

Both exposure and focus latitude were examined to see if the dye had an effect on the process window. The exposure latitude increased from 16% to 20% for the dyed resist at the same 0.35 mu dimensions (see FIG. 2).

Figure 3:
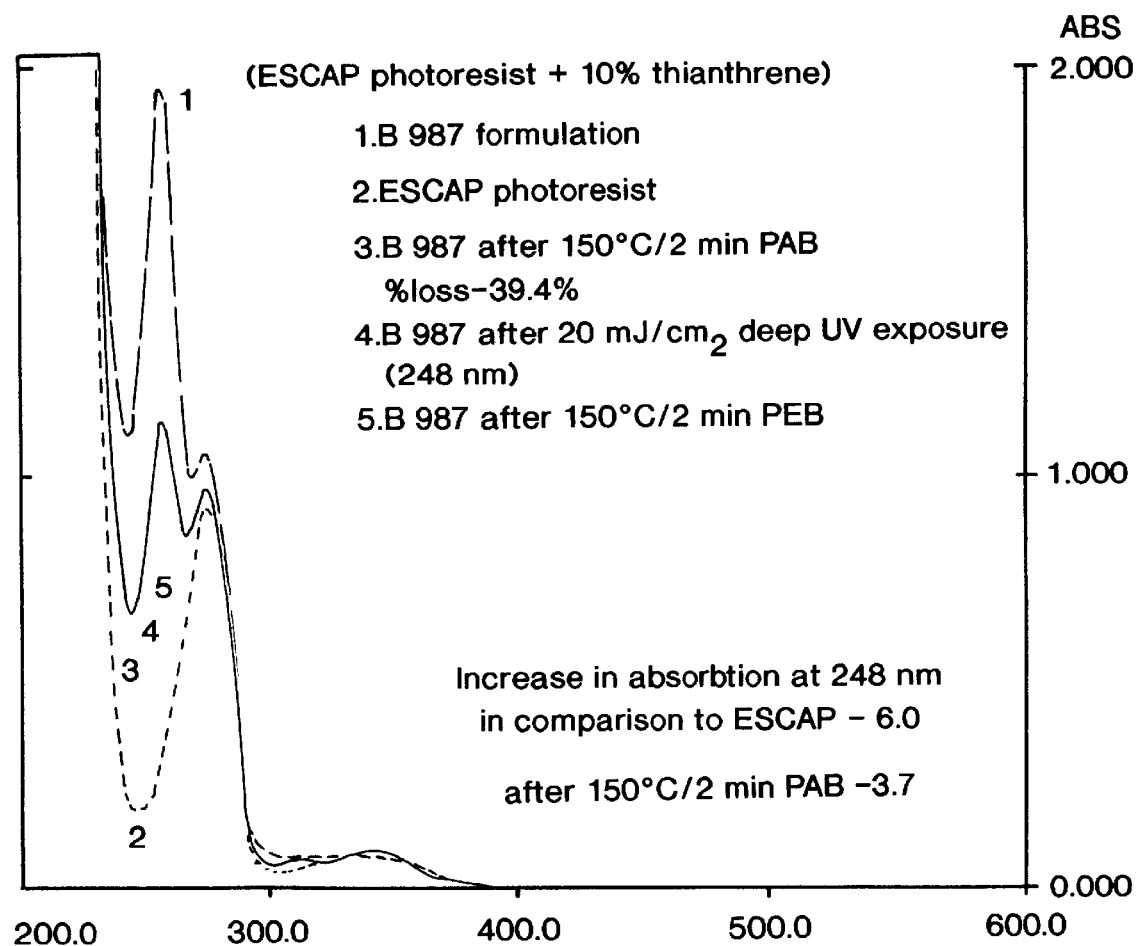
FIG. 3 is a graph illustrating the increase in absorption achievable by the present invention.

The focus latitude decreased slightly from 1.2 U for undyed resist to 1.1 u for dyed resist for 0.35 U lines and spaces. UV spectra of dyed and undyed formulations are shown in FIG. 3.

It can be seen that the absorbtion at 248 nm is about 6 times higher for the formulation with the dye compared to the undyed resist.

EXAMPLE 2

A deep UV formulation was prepared according to Example 1 except that 1-thianthrene carboxylic acid was used. Sensitivities were measured by exposure on ULTRATECH stepper at 248 nm. For the dyed formulation it was 9mJ/cm² compared to 40 mJ/cm² for the undyed version. UV measurements of 248 nm absorption for both dyed and undyed formulations before and after 160° C./2 min. showed the loss of the dye about 3.8% during PAB thermal treatment.

An increase of 248 nm absorbtion due to the addition of the dye was equal to 4.

EXAMPLE 3

A deep UV formulation was prepared according to Example 1 except that instead of thianthrene, 2,2',5',2"-terthiophene was used. An increase in the sensitivity for the dyed formulation was about 45%.

EXAMPLE 4

A deep UV formulation was prepared according to Example 1 except that instead of thianthrene, phenylsulfone was used. An increase in the sensitivity was 100%.

EXAMPLE 5

A deep UV formulation was prepared according to Example 1 except that instead of thianthrene 4,6-diphenylthieno(3,4-d)-1, 3-dioxol-2-one-5,5-dioxide was used. An increase in the sensitivity for the dyed formulation was 80%.

EXAMPLE 6

A deep UV formulation was prepared according to Example 1 except that instead of Thianthrene, 4,5-diphenyl-1,3-dioxol-2-one was used. An increase in the sensitivity for the dyed formulation was 38%.

What is claimed is:

1. A positive photoresist having increased sensitivity comprising:

a polymer matrix, a photosensitive acid generator, and at least one compound selected from the group consisting of 2,2',5',1"-terthiophene and its derivatives having the formula:

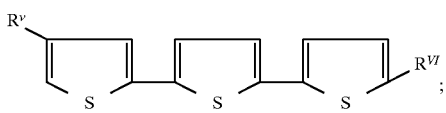

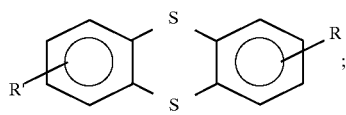

phenylsulfone, and derivatives having the formula:

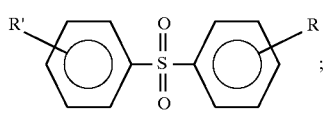

4,5-diphenyl-1,3-dioxol-2-one and mixtures thereof; and wherein R and R' in the above formulae II and III are individually selected from the group of H, alkyl having 1 to 12 carbon atoms, aryl having 6 to 18 carbon atoms,

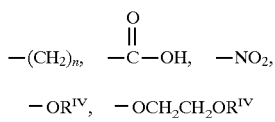

wherein $R^{IV}$ is H or alkyl having 1 to 12 carbon atoms; and wherein $R^V$ and $R^{vI}$ in the above formula I are individually selected from the group of H, alkyl having 1 to 12 carbon atoms,

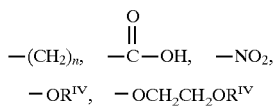

wherein $R^{IV}$ is H or alkyl having 1 to 12 carbon atoms.

2. The photoresist of claim 1 wherein said acid generator is

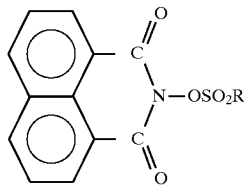

wherein $R=C_{10}H_{21}$.

3. The positive photoresist of claim 1, wherein said polymer matrix comprises a copolymer of hydroxystyrene and a member selected from the group consisting of acrylate, methacrylate and mixtures thereof.

4. The photoresist of claim 3 wherein said acid generator is

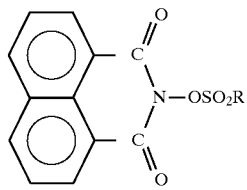

wherein $R=C_{10}H_{21}$.

5. The photoresist of claim 3 wherein said acid generator is a sulfonium or iodonium salt.

6. The photoresist of claim 11 wherein said photosensitive acid generator is a sulfonium or iodonium salt.

7. The photoresist composition of claim 1 wherein said polymer matrix is selected from the group consisting of novolak resins and copolymers of hydroxystyrene and a member selected from the group consisting of acrylate, methacrylate and mixtures thereof; poly(hydroxystyrene); poly(hydroxystyrene-co-t-butyloxycarbonyloxystyrene); poly(hydroxystyrene-co-hydroxymethylstyrene); poly(hydroxystyrene-co-acetoxymethylstyrene); alkyl substituted polyvinyl phenols; poly (p-tert-butoxy carbonyloxy-A-methylstyrene); poly (p-tert-butoxycarbonyloxystyrene); poly(tert-bulyl p-vinylbenzoate); poly (tert-butyl p-isopropenyl phenyloxyacetate); and poly(tert-butyl methacrylate).

8. The positive photoresist of claim 1, wherein said polymer contains phenolic hydroxy groups.

9. The positive photoresist of claim 1 wherein said polymer comprises copolymer of hydroxystyrene and t-butyl methacrylate.

10. The positive photoresist of claim 1 wherein said dye is 2,2',5',1"-terthiophene.

11. The photoresist of claim 1 wherein said compound is 2,2',5',1"-terthiophene or derivatives thereof.

12. The photoresist of claim 1 wherein said compound is thianthrerne or derivative thereof.

13. The photoresist of claim 1 wherein said compound is 4,6-diphenylthieno (3,4-d)-1,3-dioxol-2-one-5,5-dioxide.

14. The photoresist of claim 1 wherein said compound is phenylsulfone or derivative thereof.

15. The photoresist of claim 1 wherein said compound is 4,5-diphenyl-1,3-dioxol-2-one.

* * * * *